(12) United States Patent
Sherman

(10) Patent No.: US 11,074,801 B2
(45) Date of Patent: Jul. 27, 2021

(54) MOBILE COMMUNICATION TOWER

(71) Applicant: SAFETY SYSTEMS MANAGEMENT, LLC, Newnan, GA (US)

(72) Inventor: Cory Sherman, Newnan, GA (US)

(73) Assignee: Safety Systems Management LLC, Newnan, GA (US)

( * ) Notice: Subject to any disclaimer, the term of this patent is extended or adjusted under 35 U.S.C. 154(b) by 0 days.

(21) Appl. No.: 16/802,416

(22) Filed: Feb. 26, 2020

(65) Prior Publication Data

US 2020/0279467 A1  Sep. 3, 2020

Related U.S. Application Data

(60) Provisional application No. 62/812,473, filed on Mar. 1, 2019.

(51) Int. Cl.
| | |
|---|---|
| *G08B 21/10* | (2006.01) |
| *G08B 3/10* | (2006.01) |
| *G08B 5/38* | (2006.01) |
| *H04N 5/225* | (2006.01) |
| *H05K 5/02* | (2006.01) |
| *F16M 11/22* | (2006.01) |
| *A62C 13/78* | (2006.01) |
| *G06K 7/10* | (2006.01) |
| *H02S 20/30* | (2014.01) |

(52) U.S. Cl.
CPC ............ *G08B 21/10* (2013.01); *A62C 13/78* (2013.01); *F16M 11/22* (2013.01); *G06K 7/10366* (2013.01); *G08B 3/10* (2013.01); *G08B 5/38* (2013.01); *H04N 5/2253* (2013.01); *H05K 5/0226* (2013.01); *H05K 5/0234* (2013.01); *H02S 20/30* (2014.12)

(58) Field of Classification Search
CPC ....................................................... B60Q 1/29
See application file for complete search history.

(56) References Cited

U.S. PATENT DOCUMENTS

| | | | | |
|---|---|---|---|---|
| 2,822,451 | A * | 2/1958 | Holmes .................. | G08B 25/12 200/300 |
| 2,993,081 | A * | 7/1961 | Veldhuis .................. | H01T 4/08 174/2 |
| 3,613,793 | A * | 10/1971 | Huthsing, Jr. ....... | A62C 35/605 169/26 |
| 9,108,605 | B1 * | 8/2015 | Farnum .................. | B60T 17/16 |

(Continued)

OTHER PUBLICATIONS

Metro Elevator, McKee Intercom Systems; 2106, Metro Elevator, pp. 1 and 2. (Year: 2016).*

(Continued)

*Primary Examiner* — Nabil H Syed
*Assistant Examiner* — Cal J Eustaquio
(74) *Attorney, Agent, or Firm* — Taylor English Duma LLP

(57) ABSTRACT

A mobile communication tower assembly comprising a stand, an enclosure and a plurality of electronic components. The stand includes an attachment plate, a shaft and a base. The enclosure is connected to the attachment plate and defines a cavity. The enclosure includes a cover attached to a body. The body includes a top, a first side, a second side, a bottom and a back. The plurality of electronic components is located in the cavity of the enclosure.

14 Claims, 8 Drawing Sheets

(56) References Cited

U.S. PATENT DOCUMENTS

| | | | |
|---|---|---|---|
| 2004/0089460 A1* | 5/2004 | Richardson | A62C 5/006 169/77 |
| 2004/0127781 A1* | 7/2004 | Cable | G02B 21/16 600/407 |
| 2006/0017809 A1* | 1/2006 | Carroll | G08B 13/19656 348/158 |
| 2007/0247000 A1* | 10/2007 | Fugiel | G01M 3/243 303/122.08 |
| 2014/0049268 A1* | 2/2014 | Ramrajkar | G01M 5/0025 324/637 |
| 2014/0211490 A1* | 7/2014 | Sharpley | B60P 3/18 362/485 |
| 2014/0266745 A1* | 9/2014 | Middleton | G01F 23/30 340/618 |
| 2018/0062239 A1* | 3/2018 | McCoy | H01Q 1/3216 |
| 2018/0372246 A1* | 12/2018 | Vaccaro | H02G 3/32 |

OTHER PUBLICATIONS

Arlo; Wireless Video Camera, publicly available prior to Mar. 1, 2019, 2 pgs.
Safety Technology International; Brochure for STI Stopper II, publicly available prior to Mar. 1, 2019, 2 pgs.
Visiplex; Brochure for CT-157—Wireless Emergency Pull Station, publicly available prior to Mar. 1, 2019, 1 pg.
Visiplex; Brochure for VNS2085—High-Power Public Address Horn Speaker, publicly available prior to Mar. 1, 2019, 1 pg.
Visiplex; Brochure for VNS2098—Wall/Ceiling-Mount Strobe Light, publicly available prior to Mar. 1, 2019, 1 pg.
Visiplex; Brochure for VNS2200—Wireless AudioNisual Controller, publicly available prior to Mar. 1, 2019, 2 pgs.
Visiplex; Brochure for VNS2267—Wireless Two-Way Intercom Station, publicly available prior to Mar. 1, 2019, 1 pg.

\* cited by examiner

MOBILE COMMUNICATION TOWER

CROSS-REFERENCE TO RELATED APPLICATIONS

This application claims priority to U.S. Ser. No. 62/812,473 filed Mar. 1, 2019, which are hereby incorporated by reference herein in their entirety.

TECHNICAL FIELD

This disclosure relates to a broadcast device. More specifically, this disclosure relates to a mobile broadcast communication tower.

BACKGROUND

When on a construction site or at a temporary gathering event, such as a picnic or sporting event, there may not be a life-safety, mass communication emergency notification system at the location to alert the people or employees of an emergency. In such situations, a handheld airhorn is sometimes used as an emergency notification system. However, this would require the person responsible for sounding the airhorn to be promptly notified of the emergency and for that person to quickly locate a working airhorn. In some industries, notification of emergency situations is essential since OSHA standards may require visual and audible alarm notifications. The lack of ability to notify and communicate to employees, first responders, and the public present at the site during an emergency raises the potential for injury and/or even fatality.

SUMMARY

It is to be understood that this summary is not an extensive overview of the disclosure. This summary is exemplary and not restrictive, and it is intended neither to identify key or critical elements of the disclosure nor delineate the scope thereof. The sole purpose of this summary is to explain and exemplify certain concepts off the disclosure as an introduction to the following complete and extensive detailed description.

Disclosed is a mobile communication tower assembly comprising a stand, an enclosure and a plurality of electronic components. The stand includes an attachment plate, a shaft and a base. The enclosure is connected to the attachment plate and defines a cavity. The enclosure includes a cover attached to a body. The body includes a top, a first side, a second side, a bottom and a back. The plurality of electronic components is located in the cavity of the enclosure.

Various implementations described in the present disclosure may include additional systems, methods, features, and advantages, which may not necessarily be expressly disclosed herein but will be apparent to one of ordinary skill in the art upon examination of the following detailed description and accompanying drawings. It is intended that all such systems, methods, features, and advantages be included within the present disclosure and protected by the accompanying claims.

BRIEF DESCRIPTION OF THE DRAWINGS

The features and components of the following figures are illustrated to emphasize the general principles of the present disclosure. Corresponding features and components throughout the figures may be designated by matching reference characters for the sake of consistency and clarity.

DETAILED DESCRIPTION

Figure 1:
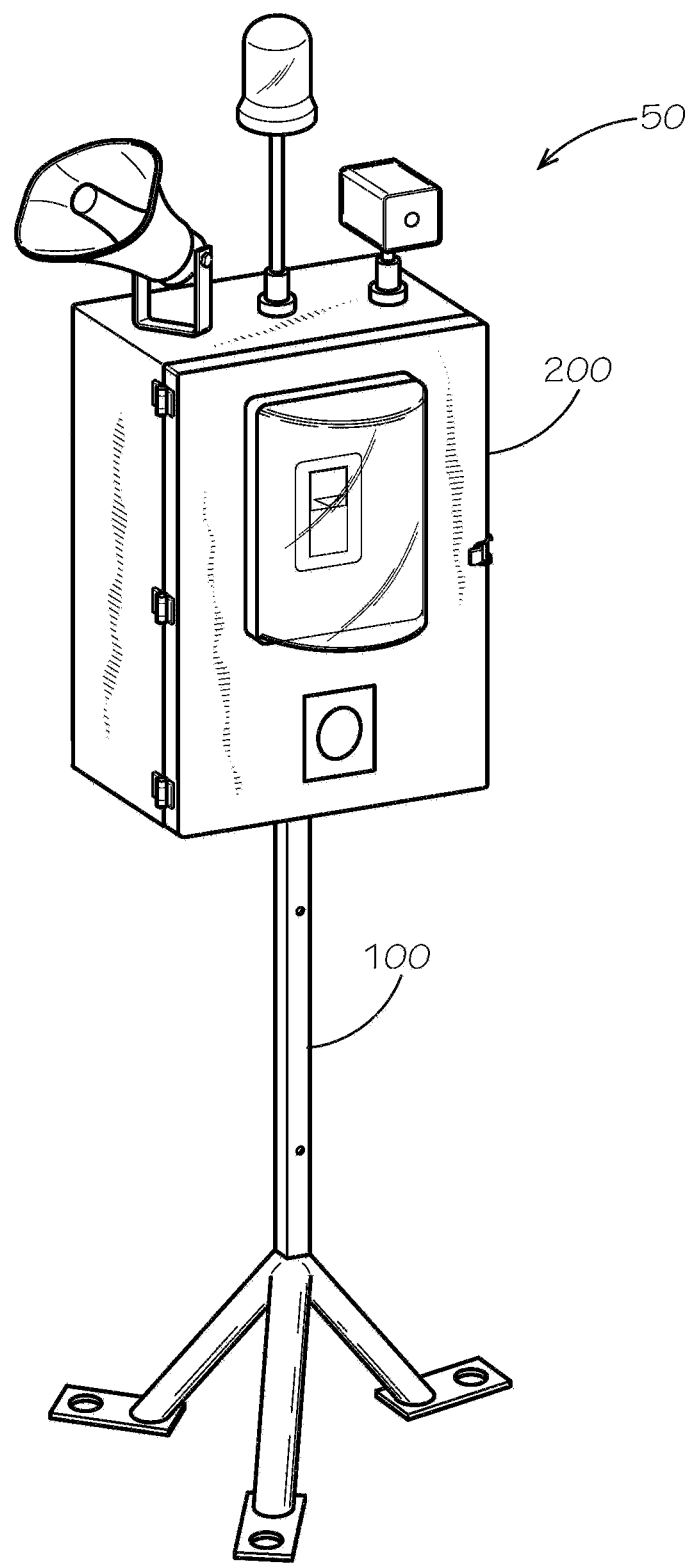
FIG. 1 is a perspective view of a mobile communication tower comprising a stand, a component enclosure and a plurality of electronic components in accordance with a first aspect of the present disclosure.

The present disclosure can be understood more readily by reference to the following detailed description, examples, drawings, and claims, and the previous and following description. However, before the present devices, systems, and/or methods are disclosed and described, it is to be understood that this disclosure is not limited to the specific devices, systems, and/or methods disclosed unless otherwise specified, and, as such, can, of course, vary. It is also to be understood that the terminology used herein is for the purpose of describing particular aspects only and is not intended to be limiting.

The following description is provided as an enabling teaching of the present devices, systems, and/or methods in its best, currently known aspect. To this end, those skilled in the relevant art will recognize and appreciate that many changes can be made to the various aspects of the present devices, systems, and/or methods described herein, while still obtaining the beneficial results of the present disclosure. It will also be apparent that some of the desired benefits of the present disclosure can be obtained by selecting some of the features of the present disclosure without utilizing other features. Accordingly, those who work in the art will recognize that many modifications and adaptations to the present disclosure are possible and can even be desirable in certain circumstances and are a part of the present disclosure. Thus, the following description is provided as illustrative of the principles of the present disclosure and not in limitation thereof.

As used throughout, the singular forms "a," "an" and "the" include plural referents unless the context clearly dictates otherwise. Thus, for example, reference to "an element" can include two or more such elements unless the context indicates otherwise.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

For purposes of the current disclosure, a material property or dimension measuring about X or substantially X on a particular measurement scale measures within a range between X plus an industry-standard upper tolerance for the specified measurement and X minus an industry-standard lower tolerance for the specified measurement. Because tolerances can vary between different materials, processes and between different models, the tolerance for a particular measurement of a particular component can fall within a range of tolerances.

As used herein, the terms "optional" or "optionally" mean that the subsequently described event or circumstance can or cannot occur, and that the description includes instances where said event or circumstance occurs and instances where it does not.

The word "or" as used herein means any one member of a particular list and also includes any combination of members of that list. Further, one should note that conditional language, such as, among others, "can," "could," "might," or "may," unless specifically stated otherwise, or otherwise understood within the context as used, is generally intended to convey that certain aspects include, while other aspects do not include, certain features, elements and/or steps. Thus, such conditional language is not generally intended to imply that features, elements and/or steps are in any way required for one or more particular aspects or that one or more particular aspects necessarily include logic for deciding, with or without user input or prompting, whether these features, elements and/or steps are included or are to be performed in any particular aspect.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific aspect or combination of aspects of the disclosed methods.

Disclosed is a mobile communication tower and associated methods, systems, devices, and various apparatus. It would be understood by one of skill in the art that the disclosed mobile communication tower is described in but a few exemplary aspects among many. No particular terminology or description should be considered limiting on the disclosure or the scope of any claims issuing therefrom.

A first aspect of a mobile communication tower is disclosed and described in FIGS. 1-4. FIG. 1 illustrates a mobile communication tower for use at a construction site, a temporary gathering event location, or some other location in which a group of people are gathered but a permanent life-safety, mass communication emergency notification system is not provided at the location to alert the people or employees of an emergency. The mobile communication tower 50 illustrated in FIG. 1 comprises a stand 100 (also shown in FIG. 2), a component enclosure 200 and a plurality of electronic components (also shown in FIGS. 3 and 4).

Figure 2:
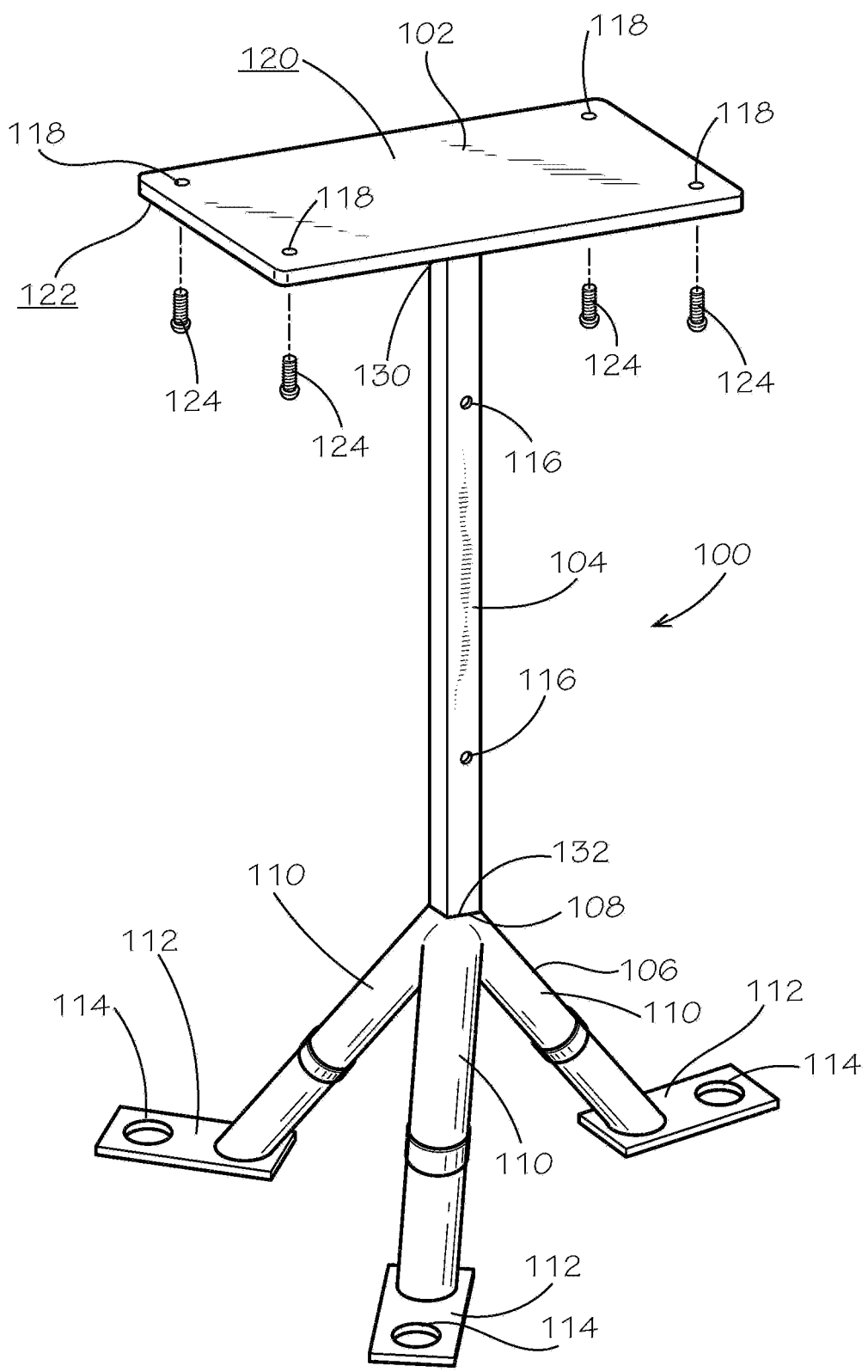
FIG. 2 is a perspective view of the stand of the mobile communication tower illustrated in FIG. 1.

As illustrated in FIG. 2, the stand 100 can comprise an attachment plate 102, a shaft 104 and a base 106. The attachment plate 102 can have a generally flat rectangular shaped upper surface 120 and a generally flat rectangular shaped bottom surface 122. The attachment plate 102 can be formed of steel, aluminum or other high strength metallic or polymeric material. The attachment plate 102 defines four holes 118 aligned with corresponding holes 240 (shown in FIG. 3) defined in the bottom of the component enclosure 200. It should be noted that the shape of the attachment plate 102 and number of holes 118, 240 defined in the attachment plate 102 and the bottom of the component enclosure 200 are for illustrative purposes only. The attachment plate 102 can be shaped other than rectangular and number of holes 118, 240 can be less or more than four. Bolts 124 can be inserted through the holes 118 defined in the attachment plate 102 and into the corresponding holes 240 defined in the bottom of the component enclosure 200 to secure the stand 100 to the component enclosure 200. The bolts 124 can be secured using rubber washers and wing-nuts for ease of disassembly, but such aspects of the attaching or fastening mechanism should not be considered as limiting on the present disclosure. It should be noted that screws, rivets other types of fastener can be used in place of bolts.

The stand shaft 104 includes a first end 130 and a second end 132. Cross section of the shaft 104 can be generally square (as illustrated in FIG. 2), round, hexagon or some other shape. The shaft 104 can be formed of steel, aluminum or other high strength metallic or polymeric material. The first end 130 of the shaft 104 can be secured or connected to the bottom surface 122 of the attachment plate 102 to form a T-shape when viewed from the front, by weld, fastener, nut and bolt, or some other attaching mechanism known in the art. Alternatively, the stand shaft 104 and the attachment plate 102 can be integrally formed as a single piece. The second end 132 of the shaft 104 is attached to the top 108 of the base 106. The second end 132 of the shaft 104 can be secured or connected to the top 108 of the base 106 by weld, fastener, nut and bolt, or some other attaching mechanism known in the art. Alternatively, the stand shaft 104 and the base 106 can be integrally formed as a single piece. The stand shaft 104 can define two spaced apart holes 116 in between the first end 130 and the second end 132. Holes 116 can be configured to receive an attachment such as a fire extinguisher (not shown) or other components. Holes 116 can also be configured to receive a bracket for an attachment. The Holes 116 can be formed by drilling, punching or formed integral with the stand shaft 104.

The stand base 106 includes three legs 110 and a foot 112 at the terminal end of each leg 110. The base 106 can be formed of steel, aluminum or other high strength metallic or polymeric material. The top 108 of the base 106 is attached to the second end 132 of the shaft 104. The three legs 110 of the base 106 forms a tripod to provide stability to the tower 50. Alternatively, the base 106 can be formed with other numbers of legs or other structure that is able to provide stability to the tower 50. Each foot 112 is general flat and parallel to the surface on which the tower 50 is placed. The length of each leg 110 can be adjustable to account for non-level or irregular surface. This allows the mobile communication tower 50 to be mounted to a variety of surfaces, including an irregular surface such as a pile or debris or a relatively smooth surface such as a platform. A hole 114 is defined in each foot 112. The holes 114 can be formed by drilling, punching or formed integral with the feet 112. The holes 114 defined in the feet 112 allow the stand 100 to be anchored to surface on which the tower 50 is placed by nailing, staking or screwing.

Figure 3:
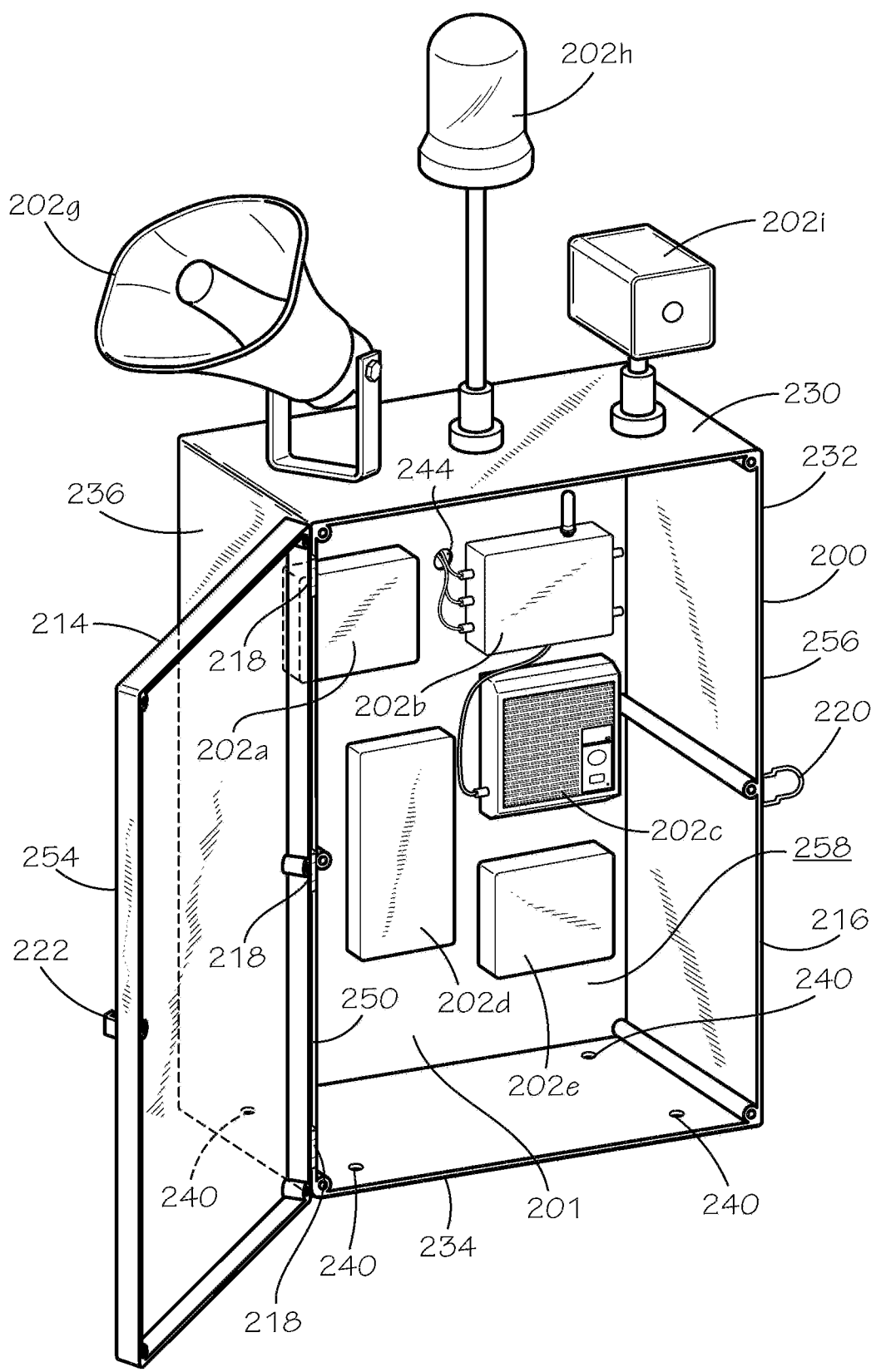
FIG. 3 is a perspective view of the component enclosure in the opened position and a plurality of electronic components of the mobile communication tower illustrated in FIG. 1.
Figure 4:
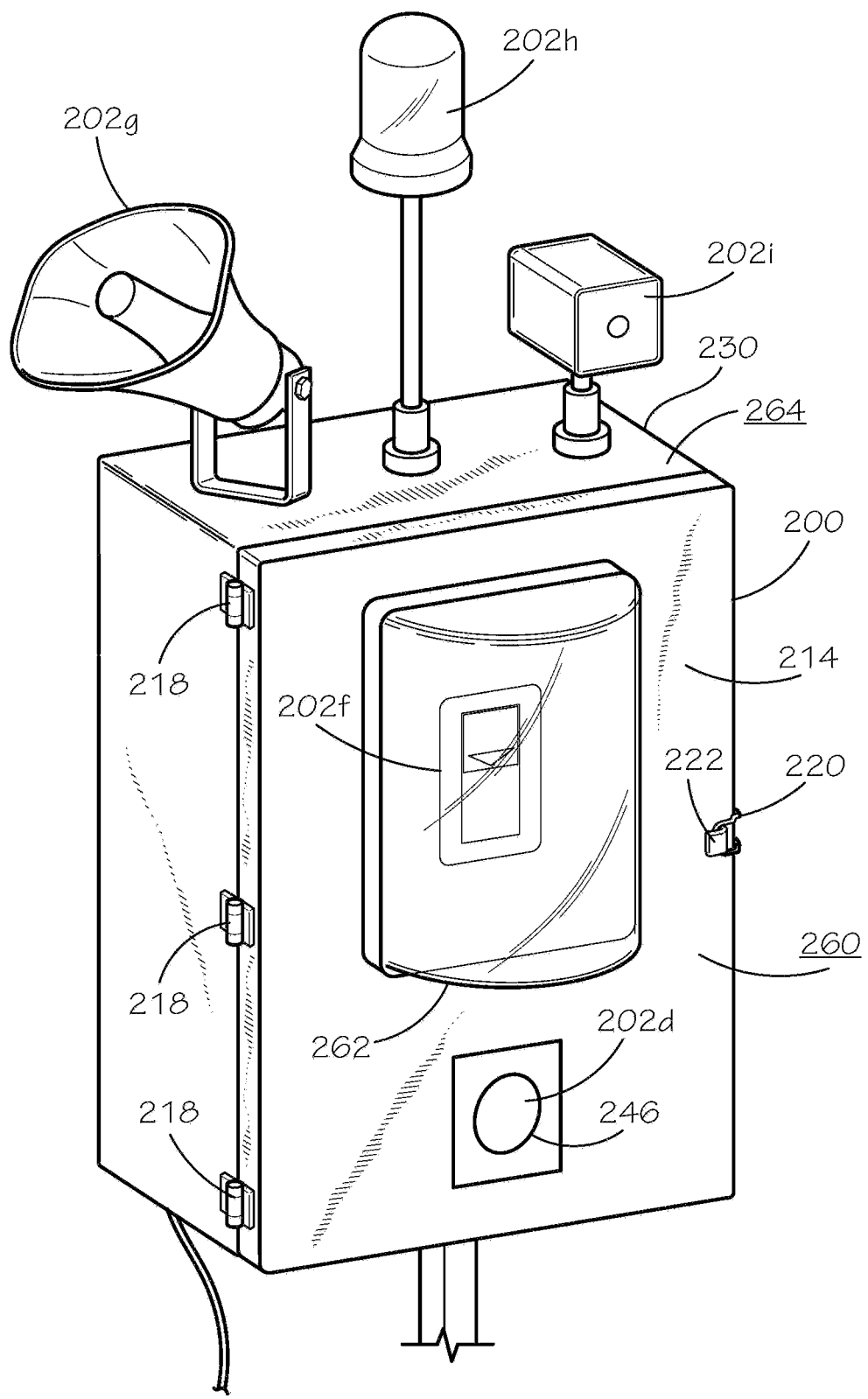
FIG. 4 is a perspective view of the component enclosure in the closed position and a plurality of electronic components of the mobile communication tower illustrated in FIG. 1.

The component enclosure 200 is illustrated in FIGS. 3-4. The component enclosure 200 comprises a body 216 and a cover or door 214 pivotably mounted to the body 216. The body 216 includes a top panel 230, a first side panel 232, a bottom panel 234, a second side panel 236 and a back panel 238. As illustrated in FIG. 3, the top panel 230, the first side panel 232, the bottom panel 234, the second side panel 236 and the back panel 238 together define a rectangular box shaped cavity 201. As previously disclosed, the bottom panel 234 defines four holes 240 aligned with the four holes 118 (shown in FIG. 2) defined in attachment plate 102 of the stand 100. The back panel 238 defines a wire passthrough hole 244 allowing wires and cables to passthrough and enter or exit the interior of the component enclosure 200. The component enclosure 200 includes three hinges 218 attached near an edge 250 of the second side panel 236 and near a first edge 252 of the cover 214 to pivotably connect the cover 214 to the second side panel 236. A latch catch 222 is attached near a second edge 254 of the cover 214, opposite the first edge 252. A latch 220 is attached near an edge 256 of the first side panel 232. The latch 220 and the latch catch 222 can be engaged to secure the cover 214 to the body 216; thus, preventing the cover 214 from inadvertently opening when the enclosure 200 is intended to be in closed position. FIGS. 3 and 4 illustrate the enclosure 200 in the shape of a rectangular enclosure, but this shape is just one aspect of many. The enclosure 200 can be formed from high-impact-resistant material such that the enclosed electronic components will be protected if the tower 50 is knocked over.

The component enclosure in the opened position, showing the interior of the enclosure 200, is illustrated in FIG. 3. The communication tower 50 can comprise a plurality of electronic components 202 configured to allow communication and be mounted to the component enclosure. The electronic components 202 can be situated in the cavity 201 of the component enclosure 200 and mounted to an inner surface 258 of the back panel 238; hence, enclosing these electronic components 202 in the enclosure 200. The enclosure 200 can be weatherproof to protect the electronic components 202, enclosed in the enclosure, from the environment. In the current aspect, the enclosure 200 is molded in plastic; however, the enclosure 200 can be formed of metal or from any material known in the art that may or may not be waterproof or weatherproof. In the current aspect as shown in FIG. 3, electronic components 202 situated in the cavity 201 and mounted to the back panel 238 can comprise a data repeater 202a, an electronics controller 202b, an intercom station 202c, an RFID reader 202d, and a battery pack 202e. The electronic components 202 can further comprise a two-way communication enclosure (not shown), Wi-Fi router and gateway (not shown), a surveillance mainframe (not shown), a 110-Watt plug (not shown), and a battery backup (not shown).

The component enclosure in the closed position, showing the exterior of enclosure 200, is illustrated in FIG. 4. In the closed position, the cover 214 of the enclosure 200 can define a window 246 to expose the RFID reader 202d for access with tags, cards, or badges without the need to unsecure the latch 220 to open the cover 214. In addition to situating the electronic components 202 in the cavity 201 of the enclosure 200, electronic components 202 can also be situated and/or mounted on the outer surfaces of the enclosure 200. Situating electronic components 202 outside the enclosure 200 allows easy access to the electronic component, permit unobstructed broadcasting of audial and visual alarms, allow direct audial and visual monitoring, unobstructed signal reception and transmission, and other features that would be beneficial when exposed outside an enclosure. In the current aspect as shown in FIG. 4, electronic components 202 that can be mounted on the cover 214 of the enclosure 200 include a pull pendent 202f. The pendant pull station 202f can be mounted on the outer surface 260 of the cover 214. A weatherproof clear protection window 262 can be mounted on the outer surface 260 of the cover 214 such that the protection window 262 surrounds the pendant pull station 202f. The protection window 262 can be opened and thus provide access to the pendant pull station 202f in case of emergency. The pendant pull station 202f can be configured to sound an alarm when pulled or triggered. The pendent pull station can also be linked to an audio and/or visual alarm or other electronic components to transmit an emergency signal to a remote monitoring system or specialist who may be able to follow up on the emergency, such as notifying the appropriate first responder.

As further shown in FIG. 4, in the current aspect, various emergency-related electronic components 202 can be mounted on outer surface 264 of the top panel 230 of the enclosure 200. These electronic components may include a weatherproof speaker 202g, a weatherproof strobe light 202h, a weatherproof surveillance camera 202i, a receiver (not shown), and an antenna (not shown). These components can be mounted to the enclosure 200 with screws, washers, nuts, or bolts, or any other attachment mechanism known in the art.

The mobile communication tower 50 can provide such capabilities as emergency and mass notification, alarm pendant activation, internet hotspots, WI/FI nodes, security surveillance, two-way communication and notification, and Radio Frequency Identification (RFID). The tower 50 can provide these capabilities in areas where they are not otherwise available, and where safety communications are desired. The tower 50 can provide an integrated solution in one mobile, compact platform. The tower 50 can be used at and moved to multiple situations and locations. Components within the enclosure can be removed and reattached as needed, in accordance with the situation.

Figure 5:
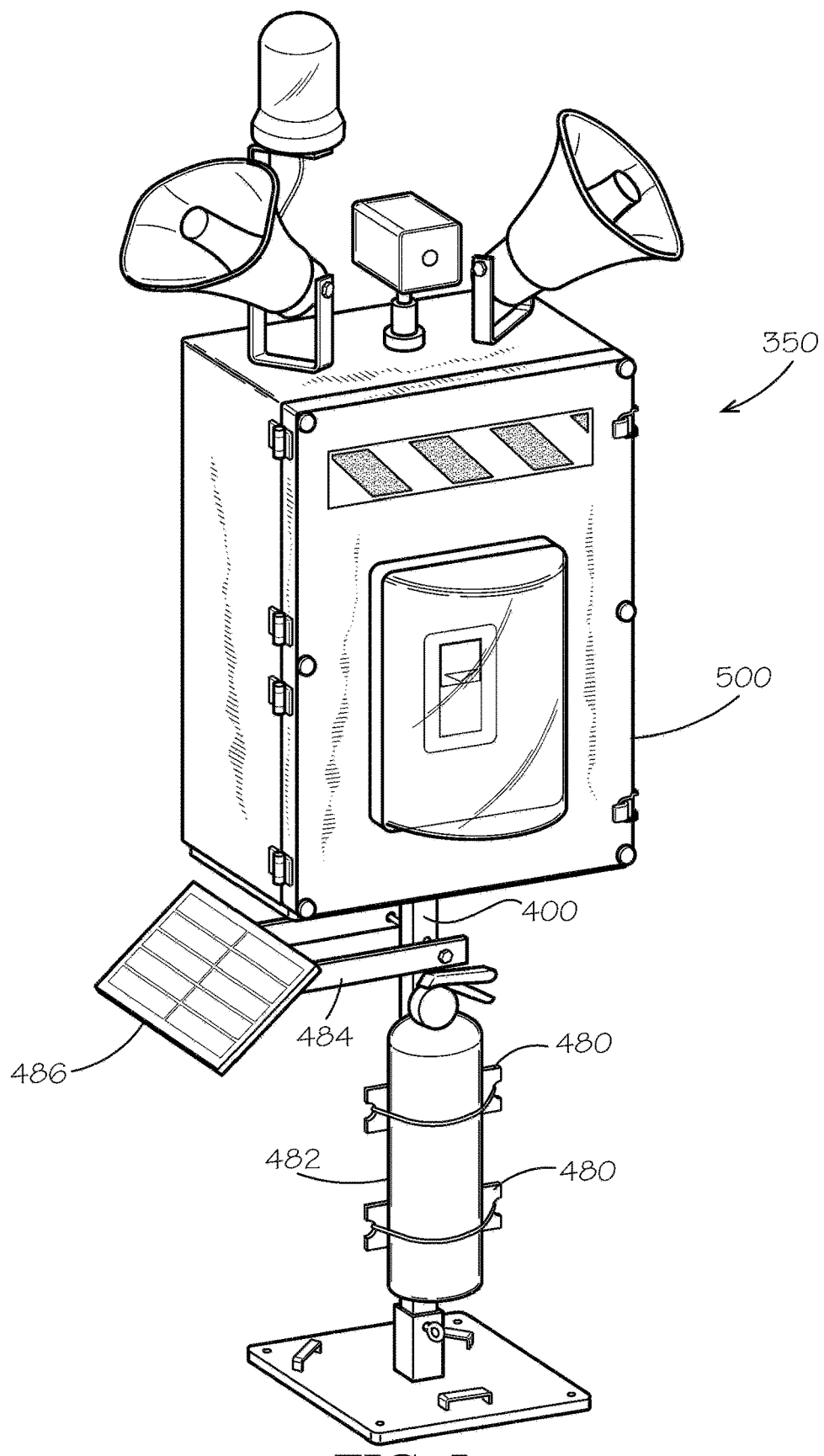
FIG. 5 is a perspective view of a mobile communication tower comprising a stand, a component enclosure and a plurality of electronic components in accordance with another aspect of the present disclosure.

A second aspect of mobile communication tower is disclosed and described in FIGS. 5-8. FIG. 5 illustrates a mobile communication tower for use at a construction site, a temporary gathering event location, or some other location in which a group of people are gathered but a permanent life-safety, mass communication emergency notification system is not provided at the location to alert the people or employees of an emergency. The mobile communication tower 350 illustrated in FIG. 5 comprises a stand 400 (also shown in FIG. 6), a component enclosure 500 and a plurality of electronic components (also shown in FIGS. 7 and 8).

Figure 6:
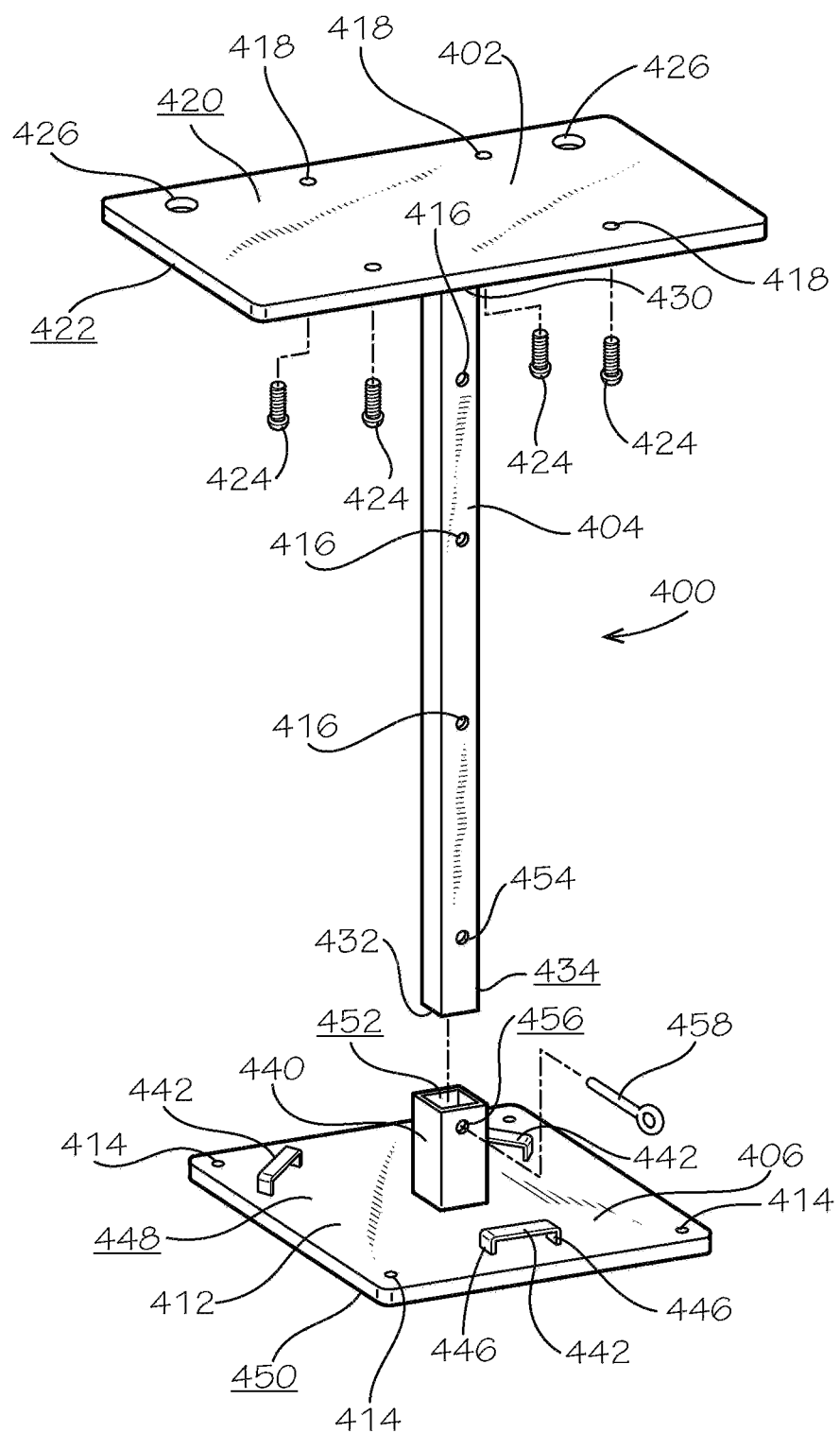
FIG. 6 is a perspective view of the stand of the mobile communication tower illustrated in FIG. 5.

As illustrated in FIG. 6, The stand 400 can comprise an attachment plate 402, a shaft 404 and a base 406. The attachment plate 402 can have a generally flat rectangular shaped upper surface 420 and a generally flat rectangular shaped bottom surface 422. The attachment plate 402 can be formed of steel, aluminum or other high strength metallic or polymeric material. The attachment plate 402 defines four holes 418 aligned with corresponding holes 540 (shown in FIG. 7) defined in the bottom of the component enclosure 500. It should be noted that the shape of the attachment plate 402 and number of holes 418, 540 defined in the attachment plate 402 and the bottom of the component enclosure 400 are for illustrative purposes only. The attachment plate 402 can be shaped other than rectangular and number of holes 418, 540 can be less or more than four. Bolts 424 can be inserted through the holes 418 defined in the attachment plate 402 and into the corresponding holes 540 defined in the bottom of the component enclosure 500 to secure the stand 400 to the component enclosure 500. The bolts 424 can be secured using rubber washers and wing-nuts for ease of disassembly, but such aspects of the attaching or fastening mechanism should not be considered as limiting on the present disclosure. It should be noted that screws, rivets other types of fastener can be used in place of bolts. The attachment plate 402 further defines two wire passthrough holes 426 aligned with corresponding wire passthrough holes 542 (shown in FIG. 7) defined in the bottom of the component enclosure 500. The wire passthrough hole 426 defined in the attachment plate 420, in conjunction with the corresponding wire passthrough hole 542 defined in the component enclosure 500 allows wires and cables, such as a power source cable, to passthrough and enter or exit the interior of the component enclosure 500.

The stand shaft 404 includes a first end 430 and a second end 432. Cross section of the shaft 404 can be generally square (as illustrated in FIG. 6), round, hexagon or some other shape. The shaft 404 can be formed of steel, aluminum or other high strength metallic or polymeric material. The first end 430 of the shaft 404 can be secured or connected to the bottom surface 422 of the attachment plate 420 to form a T-shape when viewed from the front, by weld, fastener, nut and bolt, or some other attaching mechanism known in the art. Alternatively, the stand shaft 404 and the attachment plate 402 can integrally formed as a single piece. The second end 432 of the shaft can be connected to the base 406. The stand shaft 404 can define a plurality of spaced apart holes 416 in between the first end 430 and the second end 432. Holes 416 can be configured to receive a bracket for an attachment, such as a bracket 480 for a fire extinguisher 482 (shown in FIG. 5) or a bracket 484 for a solar panel 486 (shown in FIG. 5), or a bracket for other components. It should be noted that the holes 416 can be configured to receive an attachment with or without a bracket as an intermediary between the attachment and the shaft. The holes 416 can be formed by drilling, punching or formed integral with the stand shaft 404. The solar panel 486 allows the communication tower 350 to operate in locations where no power source or power outlet is available. While the second aspect of mobile communication tower 350 illustrates the solar panel 486 attached to stand shaft 404, it should be noted that the solar panel 486 can be attached to any place on the stand, such as the top of the stand base 406 or bottom of the attachment plate 402, any other fixed location on the communication tower 350, such as an outer surface of the component enclosure 500, or as a stand alone unit separate from the communication tower 350.

The stand base 406 includes a mounting plate 412, a shaft receiver 440 and three handles 442. The mounting plate 412 can be formed of steel, aluminum or other high strength metallic or polymeric material. The mounting plate 412 has a top surface 448 and a bottom surface 450. The shaft receiver 440 has an inner surface 452. The inner surface 452 of the shaft receiver 440 is shaped similar to the outer surface 434 of the shaft 404 and sized slightly larger than the outer surface 434 of the shaft 404, such that the shaft 404 can slip into the shaft receiver 440. The shaft receiver 440 can have a length that allows bending force exerted on the shaft 404 to be distributed on the shaft receiver 440 in such a manner that the shaft 404 will not be overly wobbly or disengage from the stand base 406. The shaft receiver 440 can be formed of the same material as the mounting plate or be formed of different material. If the shaft receiver 440 is formed of the same material as the mounting plate 412, the shaft receiver 440 can be welded to top surface 448 of the mounting plate 412. Alternatively, the shaft receiver 440 can be secured to the mounting plate 412 by fastener, nut and bolt, or some other attaching mechanism known in the art. To assembly the shaft 404 to the base 406, the second end 432 of the shaft 404 is inserted into the shaft receiver 440. The shaft 404 can define holes 454 aligned with corresponding holes 456 defined in the shaft receiver 440. A pin 458 can be inserted through the holes 456 defined in the shaft receiver 440 and the holes 454 defined in the shaft 404 to prevent the shaft 404 from unintentionally separating from the base 406.

By having the stand base 406 as a separate component from the shaft 404, the base and the shaft can be easily moved as separate smaller pieces rather than as a single large piece. Furthermore, by having the base 406 as a separate component from the shaft 404, a base 406 can be mounted or anchored to a location without the need for the shaft 404 and the remainder of the communication tower 350 to also be at that particular location. This allows multiple bases to mounted at multiple locations and a single shaft attached to the reminder of the communication tower 350 to be movable from one base/location to another base/location as the need arises.

Each handle 442 of the base 406 can include a grip portion 444 and two legs 446 extending from opposite ends of the grip portion 444. The handles 442 allow the base 406 to be picked up and moved, either individually or with the entire communication tower 350. The handles 442 can be formed of the same material as the mounting plate 412 or be formed of different material. If the handles 442 are formed of the same material as the mounting plate 412, the handles 442 can be welded to top surface 448 of the mounting plate 412. Alternatively, the handles 442 can be secured to the mounting plate 412 by fastener, nut and bolt, or some other attaching mechanism known in the art. Four holes 414 are defined in the mounting plate 412. The holes 414 can be formed by drilling, punching or formed integral with the mounting plate 412. The holes 414 defined in the mounting plate 412 allows the stand 400 to be anchored to surface on which the tower 350 is place by nailing, staking or screwing.

Figure 7:
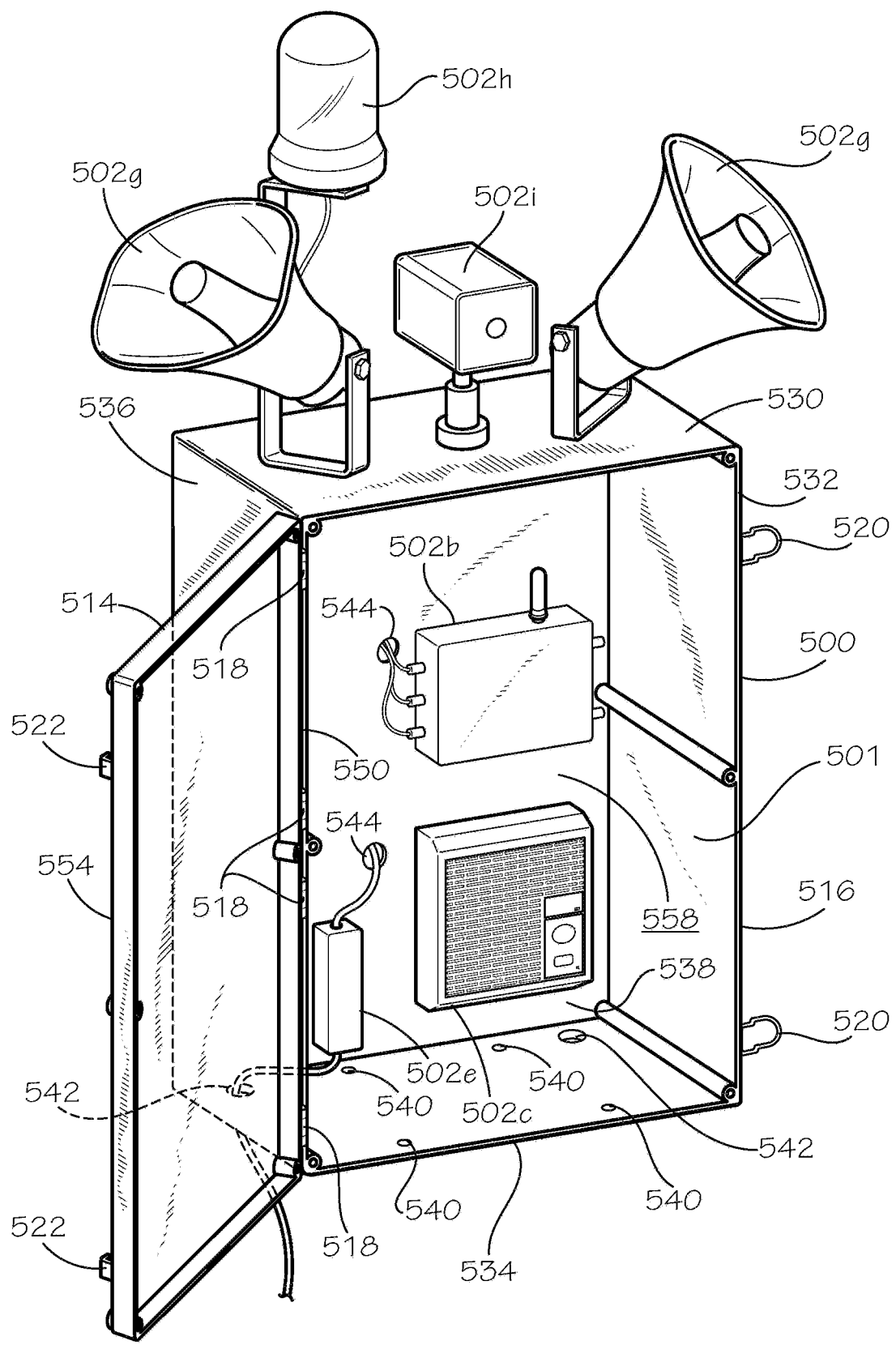
FIG. 7 is a perspective view of the component enclosure in the opened position and a plurality of electronic components of the mobile communication tower illustrated in FIG. 5.
Figure 8:
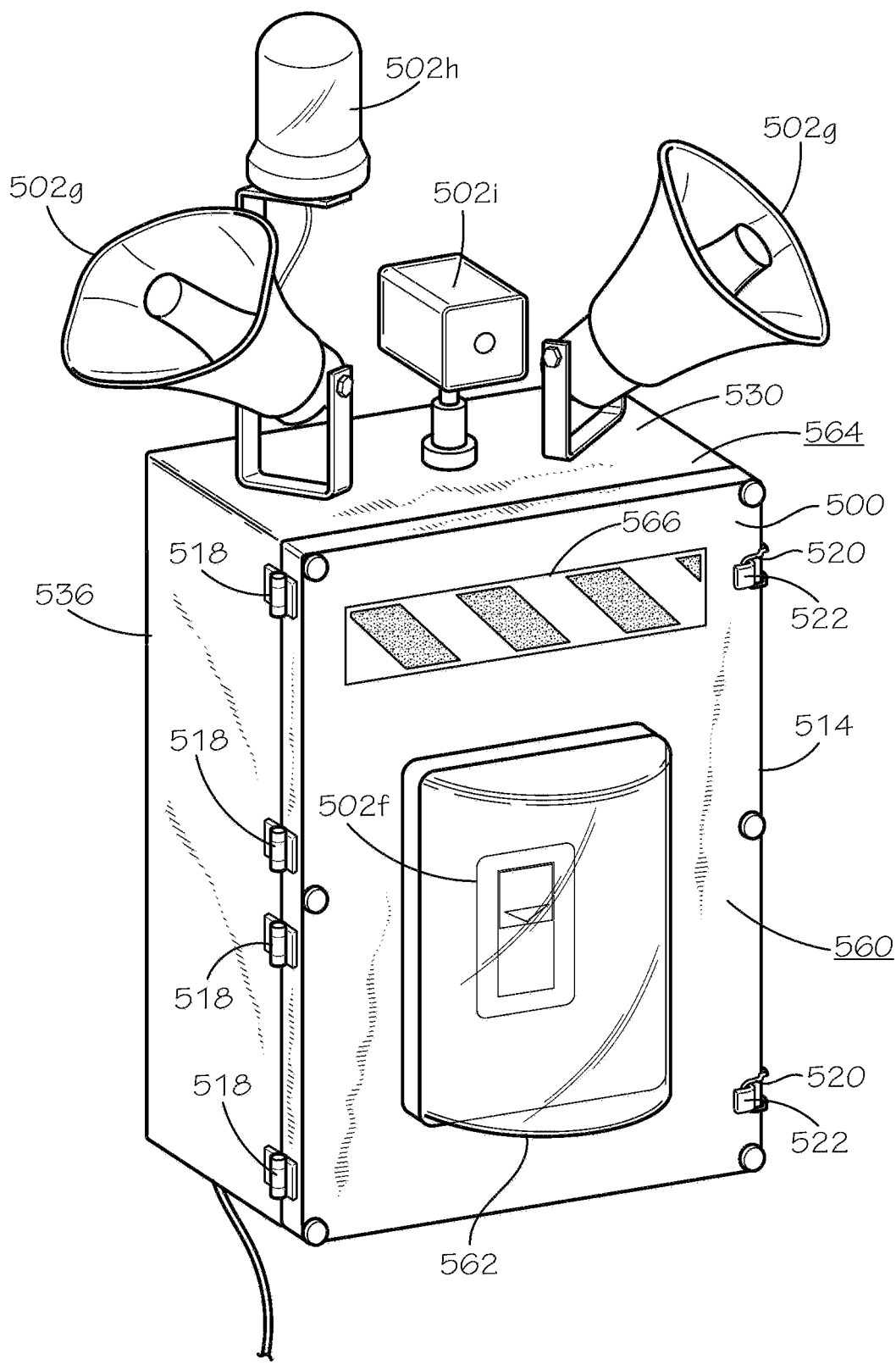
FIG. 8 is a perspective view of the component enclosure in the closed position and a plurality of electronic components of the mobile communication tower illustrated in FIG. 5.

The component enclosure 500 is illustrated in FIGS. 7-8. The component enclosure 500 comprises a body 516 and a cover or door 514 pivotably mounted to the body 516. The body 516 includes a top panel 530, a first side panel 532, a bottom panel 534, a second side panel 536 and a back panel 538. As illustrated in FIG. 7, the top panel 530, the first side panel 532, the bottom panel 534, the second side panel 536 and the back panel 538 together define a rectangular box shaped cavity 501. As previously disclosed, the bottom panel 534 defines four holes 540 aligned with the four holes 418 (shown in FIG. 6) defined in attachment plate 402 of the stand 400. The bottom panel 534 also defines two wire passthrough holes 542 aligned with the two wire passthrough holes 426 (shown in FIG. 6) defined in attachment plate 402. The back panel 538 defines two wire passthrough holes 544 allowing wires and cables to passthrough and enter or exit the interior of the component enclosure 500. The component enclosure includes four hinges 518 attached near an edge 550 of the second side panel 536 and near a first edge 552 of the cover 514 to pivotably connect the cover 514 to the second side panel 536. Two latch catches 522 are attached near a second edge 554 of the cover 514, opposite the first edge 552. Two latches 520 are attached near an edge 556 of the first side panel 532. The latches 520 and the latch catches 522 can be engaged to secure the cover 514 to the body 516; thus, preventing the cover 514 from inadvertently opening when the enclosure 500 is intended to be in closed position. FIGS. 7 and 8 illustrate the enclosure 500 in the shape of a rectangular enclosure, but this shape is just one aspect of many. The enclosure 500 can be formed from high-impact-resistant material such that the enclosed electronic components will be protected if the tower 350 is knocked over.

The component enclosure in the opened position, showing the interior of the enclosure 500, is illustrated in FIG. 7. The communication tower 350 can comprise a plurality of electronic components 502 configured to allow communication and be mounted to the component enclosure. The electronic components 502 can be situated in the cavity 501 of the component enclosure and mounted to an inner surface 558 of the back panel 538; hence, enclosing these electronic components 502 in the enclosure 500. The enclosure 500 can be weatherproof to protect the electronic components, enclosed in the enclosure, from the environment. In the current aspect, the enclosure 500 is molded in plastic; however, the enclosure 500 can be formed of metal or from any material known in the art that may or may not be waterproof or weatherproof. In the current aspect as shown in FIG. 7, electronic components 502 situated in the cavity 501 and mounted to the back panel 538 can comprise an electronics controller 502b, a 2-way intercom station 502c, and a battery pack 502e. The electronic components 502 can further comprise a data repeater (not shown), a RFID reader (not shown), a two-way communication enclosure (not shown), Wi-Fi router and gateway (not shown), a surveillance mainframe (not shown), a bar code scanner (not shown), a cellar amplifier and booster (not shown), a 110-Watt plug (not shown), and a battery backup (not shown). The electronic controller 502b can have the capability to be wirelessly sync to another electronic component, such as the emergency pendent pull station 502f and the video surveillance camera 502i (to be discussed later). The ability for the electronic controller 502b to wirelessly sync to other electronic components eliminates the need to hardwire the electronic controller to these electronic components for which the electronic controller 502b is synced.

The component enclosure in the closed position, showing the exterior of enclosure 500, is illustrated in FIG. 8. In addition to situating the electronic components 502 in the cavity 501 of the enclosure 500, electronic components 502 can also be situated and/or mounted on the outer surfaces of the enclosure 500. Situating electronic components 502 outside the enclosure 500 allows easy access to the electronic component, permit unobstructed broadcasting of audial and visual alarms, allow direct audial and visual monitoring, unobstructed signal reception and transmission, and other features that would be beneficial when exposed outside an enclosure. In the current aspect as shown in FIG. 8, electronic components 502 that can be mounted on the cover 514 of the enclosure 500 include a pull pendent station 502f. The pendant pull station 502f can be mounted on the outer surface 560 of the cover 514. A weatherproof clear protection window 562 can be mounted on the outer surface 560 of the cover 514 such that the protective window 562 surrounds the pendant pull station 502f. The protection window 562 can be opened and thus provide access to the pendant pull station 502f in case of emergency. The pendant pull station 502f can be configured to sound an alarm when pulled or triggered. The pendent pull station can also be linked to an audio and/or visual alarm or other electronic components to transmit an emergency signal to a remote monitoring system or specialist who may be able to follow up on the emergency, such as notifying the appropriate first responder. To allow the mobile communication tower 350 to be more visible, a reflective material 566 in the form of a tape or paint can be applied on the outer surface 560 of the cover 514.

As further shown in FIG. 8, in the current aspect, various emergency-related electronic components 502 can be mounted on outer surface 564 of the top panel 530 of the enclosure 500. These electronic components may include weatherproof high power public announcement speakers 502g, a weatherproof amber strobe light 502h, a weatherproof wireless video surveillance camera 502i, a receiver (not shown), and an antenna (not shown). These components can be mounted to the enclosure 500 with screws, washers, nuts, or bolts, or any other attachment mechanism known in the art.

One should note that conditional language, such as, among others, "can," "could," "might," or "may," unless specifically stated otherwise, or otherwise understood within the context as used, is generally intended to convey that certain aspects include, while other aspects do not include, certain features, elements and/or steps. Thus, such conditional language is not generally intended to imply that features, elements and/or steps are in any way required for one or more particular aspects or that one or more particular aspects necessarily include logic for deciding, with or without user input or prompting, whether these features, elements and/or steps are included or are to be performed in any particular aspect.

It should be emphasized that the above-described aspects are merely possible examples of implementations, merely set forth for a clear understanding of the principles of the present disclosure. Any process descriptions or blocks in flow diagrams should be understood as representing modules, segments, or portions of code which include one or more executable instructions for implementing specific logical functions or steps in the process, and alternate implementations are included in which functions may not be included or executed at all, may be executed out of order from that shown or discussed, including substantially concurrently or in reverse order, depending on the functionality involved, as would be understood by those reasonably skilled in the art of the present disclosure. Many variations and modifications may be made to the above-described aspect(s) without departing substantially from the spirit and principles of the present disclosure. Further, the scope of the present disclosure is intended to cover any and all combinations and sub-combinations of all elements, features, and aspects discussed above. All such modifications and variations are intended to be included herein within the scope of the present disclosure, and all possible claims to individual aspects or combinations of elements or steps are intended to be supported by the present disclosure.

That which is claimed is:
1. A mobile communication tower assembly comprising:
a stand including an attachment plate, a shaft and a base;
an enclosure connected to the attachment plate and defining a cavity and including a cover attached to a body, the body including a top, a first side, a second side, a bottom and a back, and wherein the cover comprises an RFID window and an outer surface;

a plurality of electronic components located in the cavity, the plurality of electronic components including an electronics controller and an RFID reader;

a pendant pull station attached to the outer surface of the cover;

a protection window attached to the outer surface of the cover and surrounding the pendant pull station;

a camera attached to the enclosure;

a latch for securing the cover to the body of the enclosure in a closed position; and an audio or visual alarm linked to the pendant pull station, the audio or visual alarm attached to an outer surface of the enclosure, wherein the RFID window exposes the RFID reader and provides access to the RFID reader without requiring the latch to be unsecured to open the cover, and the electronics controller wirelessly syncs with the camera and the pendant pull station.

2. The mobile communication tower assembly of claim 1, wherein the cover is pivotably attached to the body.

3. The mobile communication tower assembly of claim 1, wherein the base includes a tripod.

4. The mobile communication tower assembly of claim 1, wherein the plurality of electronic components includes a first electronic component attached to the back of the body.

5. The mobile communication tower assembly of claim 1, wherein the plurality of electronic components comprises a data repeater.

6. The mobile communication tower assembly of claim 1, wherein the plurality of electronic components comprises an intercom station.

7. The mobile communication tower assembly of claim 1, wherein the plurality of electronic components comprises a battery pack.

8. The mobile communication tower assembly of claim 1, wherein the audio or visual alarm is a waterproof speaker.

9. The mobile communication tower assembly of claim 1, wherein the audio or visual alarm is a strobe light.

10. The mobile communication tower assembly of claim 1, wherein the shaft defines a plurality of holes for mounting at least one accessory.

11. The mobile communication tower assembly of claim 10, wherein the accessory is a fire extinguisher.

12. The mobile communication tower assembly of claim 10, wherein the accessory is a solar panel.

13. A mobile communication tower assembly comprising:
a stand including an attachment plate, a shaft and a base;
an enclosure connected to the attachment plate and defining a cavity and including a cover attached to a body and a window formed in the cover, the body including a top, a first side, a second side, a bottom and a back;
a pull pendant attached to the enclosure and linked to an electronics controller to transmit an emergency signal to a remote monitoring system; and
a camera attached to the enclosure and linked to the electronics controller,
wherein the electronics controller wirelessly syncs with the camera and the pull pendant.

14. The mobile communication tower assembly of claim 13, wherein the pull pendant is attached to an outer surface of the cover.

* * * * *